US008006029B2

United States Patent
Ganesan et al.

(10) Patent No.: US 8,006,029 B2
(45) Date of Patent: Aug. 23, 2011

(54) DDR FLASH IMPLEMENTATION WITH DIRECT REGISTER ACCESS TO LEGACY FLASH FUNCTIONS

(75) Inventors: Ramkarthik Ganesan, Folsom, CA (US); Saad Monasa, Sacramento, CA (US)

(73) Assignee: Intel Corporation, Santa Clara, CA (US)

( * ) Notice: Subject to any disclaimer, the term of this patent is extended or adjusted under 35 U.S.C. 154(b) by 757 days.

(21) Appl. No.: 11/607,655

(22) Filed: Nov. 30, 2006

(65) Prior Publication Data

US 2008/0133821 A1    Jun. 5, 2008

(51) Int. Cl.
 *G06F 12/00* (2006.01)
(52) U.S. Cl. .................. 711/103; 711/E12.008; 711/167
(58) Field of Classification Search .................. None
See application file for complete search history.

(56) References Cited

U.S. PATENT DOCUMENTS

| | | | | |
|---|---|---|---|---|
| 5,758,113 | A * | 5/1998 | Peet et al. ...................... | 712/203 |
| 2001/0004335 | A1 * | 6/2001 | Murakami ...................... | 365/233 |
| 2004/0049629 | A1 * | 3/2004 | Miura et al. .................... | 711/105 |
| 2005/0086553 | A1 * | 4/2005 | Spencer ........................ | 713/600 |
| 2005/0206420 | A1 * | 9/2005 | Labrum et al. ................. | 327/175 |
| 2006/0280262 | A1 * | 12/2006 | Malladi ........................ | 375/299 |

OTHER PUBLICATIONS wiseGeek, What Is DDR Ram?, Jun. 23, 2006, Conjecture Corp.*

* cited by examiner

*Primary Examiner* — Reginald G Bragdon
*Assistant Examiner* — Baboucarr Faal

(57) ABSTRACT

A Double Data Rate (DDR) nonvolatile memory for use with a wireless device. A host processor transfers commands and data through a DDR interface of the nonvolatile memory. The DDR nonvolatile memory implements legacy flash functions while maintaining DDR behavior.

15 Claims, 3 Drawing Sheets

DDR FLASH IMPLEMENTATION WITH DIRECT REGISTER ACCESS TO LEGACY FLASH FUNCTIONS

BACKGROUND OF THE INVENTION

Recent developments in a number of different digital technologies have greatly increased the need to transfer large amounts of data from one device to another or across a network to another system. Technological developments permit digitization and compression of large amounts of voice, video, imaging, and data information, which may be rapidly transmitted from computers and other digital equipment to other devices within the network. Computers have faster central processing units and substantially increased memory capabilities, which have increased the demand for devices that can more quickly store and transfer larger amounts of data.

These developments in digital technology have stimulated a need to deliver ever faster storage devices to supply data to these processing units. Double Data Rate (DDR) SDRAM included in main memories for computing systems provides improvements in performance but does not provide permanent storage. Further improvements in faster, permanent data storage are needed.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
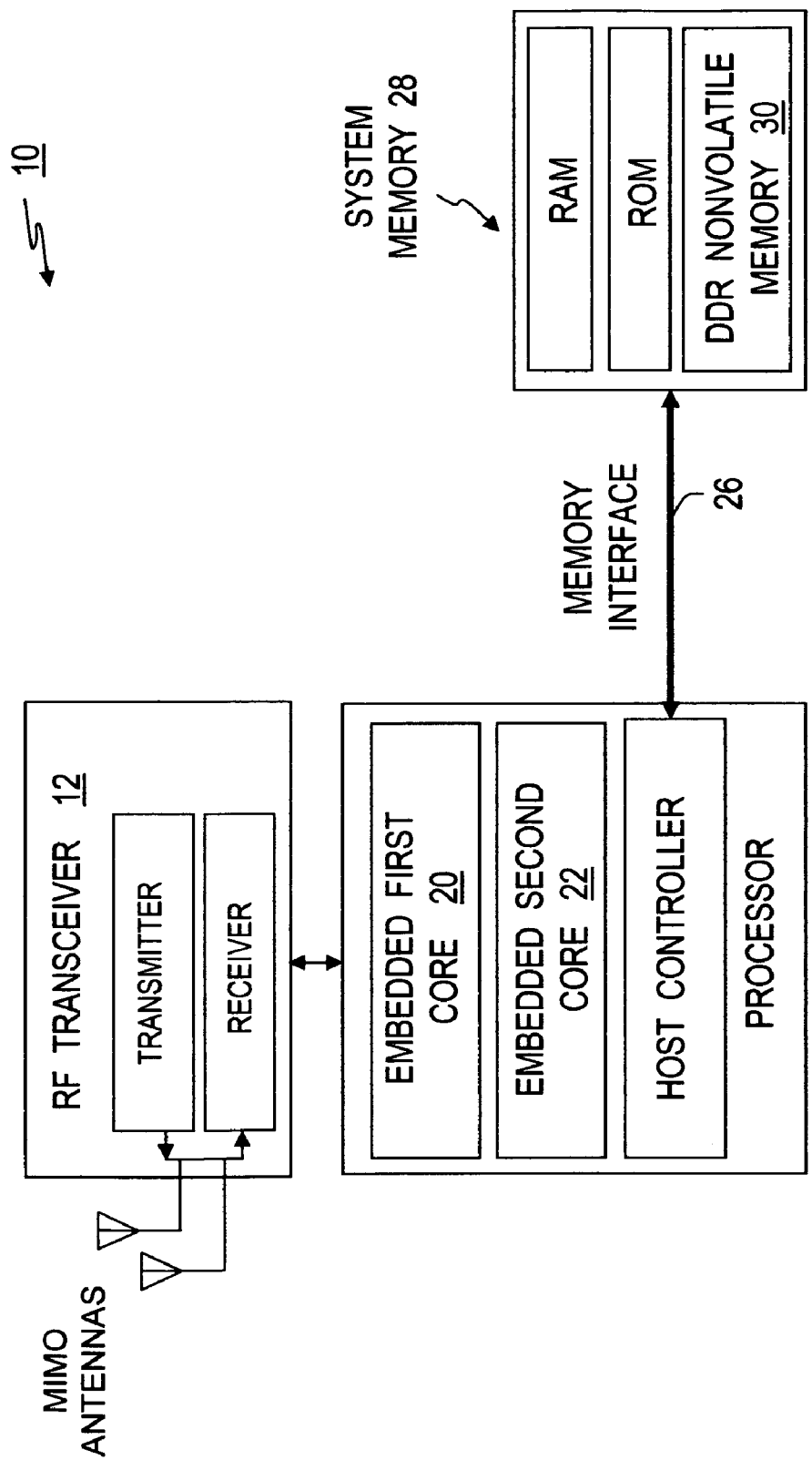
FIG. 1 is a diagram that illustrates a wireless device and a Double Data Rate (DDR) nonvolatile memory implementation with direct register access to legacy flash functions in accordance with the present invention.

It will be appreciated that for simplicity and clarity of illustration, elements illustrated in the figures have not necessarily been drawn to scale. For example, the dimensions of some of the elements may be exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

As shown in FIG. 1, the embodiment illustrates a device 10 as a wireless communications device that includes a radio to allow communication with other devices. Accordingly, communications device 10 may operate in a wireless network and be any type of device capable of communicating in an RF/location space with another device. However, it should be pointed out that device 10 is not limited to wireless embodiments and the present invention may have applications in a variety of products. For instance, the claimed subject matter may be incorporated into desktop computers, laptops, smart phones, MP3 players, cameras, communicators and Personal Digital Assistants (PDAs), medical or biotech equipment, automotive safety and protective equipment, automotive infotainment products, etc. However, it should be understood that the scope of the present invention is not limited to these examples.

The figure illustrates the wireless embodiment where a transceiver 12 receives and transmits a modulated signal from multiple antennas. Analog front end transceiver 12 may be a stand-alone Radio Frequency (RF) discrete or integrated analog circuit. Transceiver 12 may also be embedded with a processor as a mixed-mode integrated circuit, where the processor, in general, processes functions that fetch instructions, generate decodes, find operands, and perform appropriate actions, then stores results. The processor may include baseband and applications processing functions and utilize one or more processor cores to handle application functions and allow processing workloads to be shared across the cores.

The processor may transfer data through an interface 26 to a system memory 28 that may include a combination of memories such as a Random Access Memory (RAM), a Read Only Memory (ROM) and a nonvolatile memory, although neither the type of memory, variety of memories, nor combination of memories included in system memory 28 is a limitation of the present invention. Nonvolatile memory 26 may be a memory such as, for example, an ETOX™ Flash NOR Memory, an Electrically Erasable and Programmable Read Only Memory (EEPROM), a Ferroelectric Random Access Memory (FRAM), a Polymer Ferroelectric Random Access Memory (PFRAM), a Magnetic Random Access Memory (MRAM), an Ovonics Unified Memory (OUM), or any other device capable of storing instructions and/or data and retaining that information even with device 10 in a power conservation mode. However, it should be understood that the scope of the present invention is not limited to these examples for a nonvolatile memory.

In accordance with the present invention the architecture of device 10 includes a Double Data Rate (DDR) nonvolatile memory 30 as a high-bandwidth technology that supports data transfers on both the rising and falling edges of each clock cycle. The clock signal transitions from "0" to "1" and back to "0" each cycle with the first transition called the "rising edge" and the second transition the "falling edge". Normally only one of these clock signal transitions is used to trigger a data transfer but with DDR nonvolatile memory 30 both clock edges are used, effectively doubling the memory's bandwidth by transferring data twice per clock signal. Again, in accordance with the present invention the DDR nonvolatile memory 30 architecture accommodates legacy flash functions while implementing DDR behavior.

Figure 2:
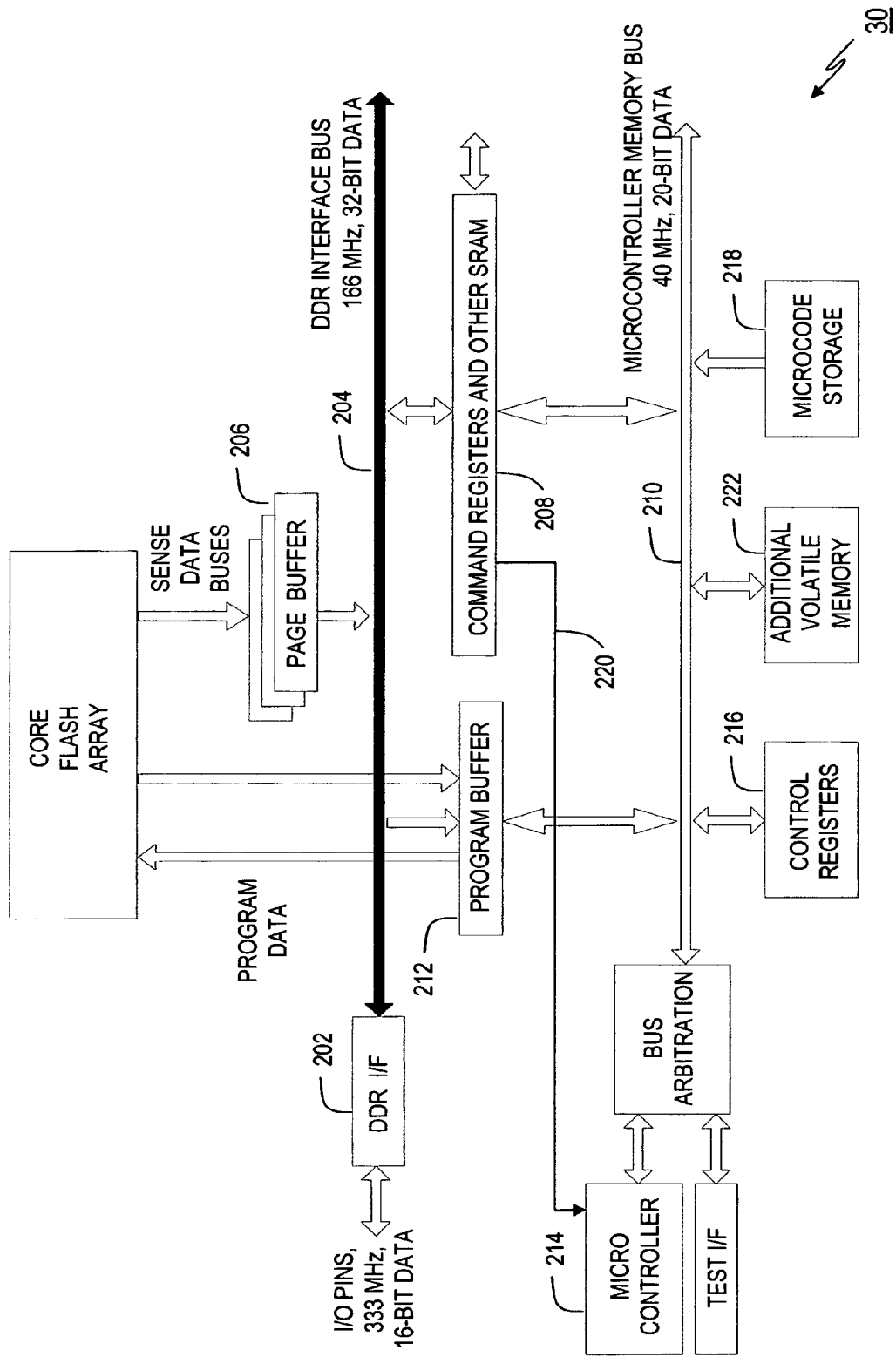
FIG. 2 is a diagram that illustrates an embodiment of the DDR nonvolatile memory in accordance with the present invention.

FIG. 2 is a block diagram that illustrates one embodiment of the present invention for DDR nonvolatile memory 30. The embodiment illustrates a structure to access the various registers in the flash device directly during the DDR burst protocol. A DDR I/F block 202 located within DDR nonvolatile memory 30 provides an interface between the host processor and other memory blocks such as the memory arrays, registers and microcontroller. DDR I/F block 202 is designed to transfer two data words per clock cycle at the I/O pins for a single read access of the DDR nonvolatile memory 30. The DDR I/F block 202 is connected to a DDR interface bus 204 that transfers data between the various buffers and registers in the memory device and the external host processor. In addition, multiple page buffers 206 hold array data for burst reads, and thus, the DDR I/F block 202 transfers the page buffer data to the host processor system at both edges of the system clock, converting the 32 bit single edged data within the flash device to a 16 bit double edged data to the host processor system.

In addition to the host processor system accessing arrayed data, non-arrayed data stored in one of the SRAM arrays or registers located in block 208 may be accessed through a burst read. Data is placed on the DDR interface bus 204 for transfer to the host processor through DDR I/F block 202. Further, the stored data in command register block 208 may also be accessed by a microcontroller 214 that is embedded within DDR nonvolatile memory 30. Under control of microcontroller 214, stored data within command register block 208 may be transferred to the internal microcontroller memory bus 210 and used to configure the DDR nonvolatile memory 30.

Program buffer data stored in program buffer 212 may also be accessed by microcontroller 214 to initiate the nonvolatile memory array program operation. Microcontroller 214 may also use the microcontroller memory bus 210 to update status bits in the status register of control registers 216. Status bits may be burst out of the status register to the DDR interface bus 204 and the DDR I/F block 202 on a host processor system request.

Note that microcontroller 214 may manage complex memory operations internal to DDR nonvolatile memory 30 without intervention from the host processor. Microcontroller 214 may access program code from microcode storage 218 and receive data needed for operations through microcontroller memory bus 210. The different data types are memory mapped on the microcontroller memory bus 210 for easy access. Some data types are shared between microcontroller memory bus 210 and the DDR interface bus 204 to provide the ability for the host processor, as well as the internal microcontroller 214, to access and manipulate memory data.

It is understood that flash memories have read latencies typically measured in nanoseconds (ns) that are similar to read latencies for SDRAMs. However, flash memories have program time latencies in the order of microseconds whereas SDRAMs do not exhibit comparable latencies when writing. It should be pointed out that the architecture illustrated in FIG. 2 for DDR nonvolatile memory 30 accounts for significant differences in the technologies of SDRAMs compared to flash memory devices, especially in the way data is accessed and written. Therefore, due to the latencies inherent in the flash memory technology, DDR nonvolatile memory 30 performs foreground reads but background write operations (program/erase) implemented with large buffers to write the data. Status checking mechanisms may be used to indicate the write progress.

Further, DDR nonvolatile memory 30 distinguishes array accesses from non-array accesses. DDR nonvolatile memory 30 may use the address input to determine the type of array accesses, using a memory map for non-array data in one embodiment and overlaying over the array space in another embodiment. Note that non-programmable read areas may or may not be part of the memory map. By way of example of determining the type of array accesses, microcontroller 214 may initiate a memory access with an "active" command and DDR nonvolatile memory 30 monitors the address to identify whether the main core flash array is being accessed or whether a non-array access to command registers and SRAM or registers 208 is being accessed. If the access is to the main core flash array then data for the array access is sensed and loaded onto one of the page buffers 206, i.e., one of the four row buffers selected by the bank address.

On the other hand, if the access is a non-array access and directed to the command registers and SRAM 208, DDR nonvolatile memory 30 decodes the access space during the "active" cycle and selects the appropriate register or SRAM element. No data transfer occurs from these registers to the row buffers beyond enabling the decode path for these registers or SRAMs. Then, when a "read" command is issued as the next step by microcontroller 214, instead of outputting the data from the row buffers DDR nonvolatile memory 30 directly reads the data from the register or the SRAM that was selected in the previous "active" cycle.

Flash device writes are not coherent by nature, and thus, long time intervals may be needed to internally transfer data that is to be written to the core flash array. During this time interval, the data from the array reads will not match the data previously written by microcontroller 214. Therefore, DDR nonvolatile memory 30 does not perform writes using the row buffers, but instead writes directly to the command registers and SRAM 208. Then, the data stored in command registers and SRAM 208 may be used to either configure the flash devices (command writes) or program the core flash array with different data. Again, note that row buffers are used only for array reads and during a write operation the data is written directly to the command registers and SRAM 208 instead of page buffers 206.

The present architecture for DDR nonvolatile memory 30 maintains the interface similarities to DDR SRAM, and by so doing, reduces controller redesign on the system level as the existing controllers may work on DDR nonvolatile memory 30 with minimal changes. Differences between the SDRAM DDR interface and the interface to DDR nonvolatile memory 30 may be controlled through software (for example writing to non array space). The present architecture for DDR nonvolatile memory 30 reduces the coherency issues with flash data transfers. Memory writes are directly to the registers, so there is no intermediate state with data existing in the row buffers to then be transferred in the background. Whenever data in the registers is read back, the updated data or current data is always available.

Also, by directly writing to the destination registers, the response of DDR nonvolatile memory 30 is predictable. By way of example, if microcontroller 214 issues commands to reconfigure the flash device differently, the write is directly to the destination registers and the response to the command is immediate. This is in contrast to writing to the row buffers first and then transferring data in the background where the latency for command execution is difficult to predict.

Another advantage attributable to the architecture of DDR nonvolatile memory 30 is that read incoherency for registers its avoided. This is important for a status read where out of date information gives the wrong indication to a microcontroller. DDR nonvolatile memory 30 may poll for program or erase status and correctly receive current and updated data by directly reading the register data.

Figure 3:
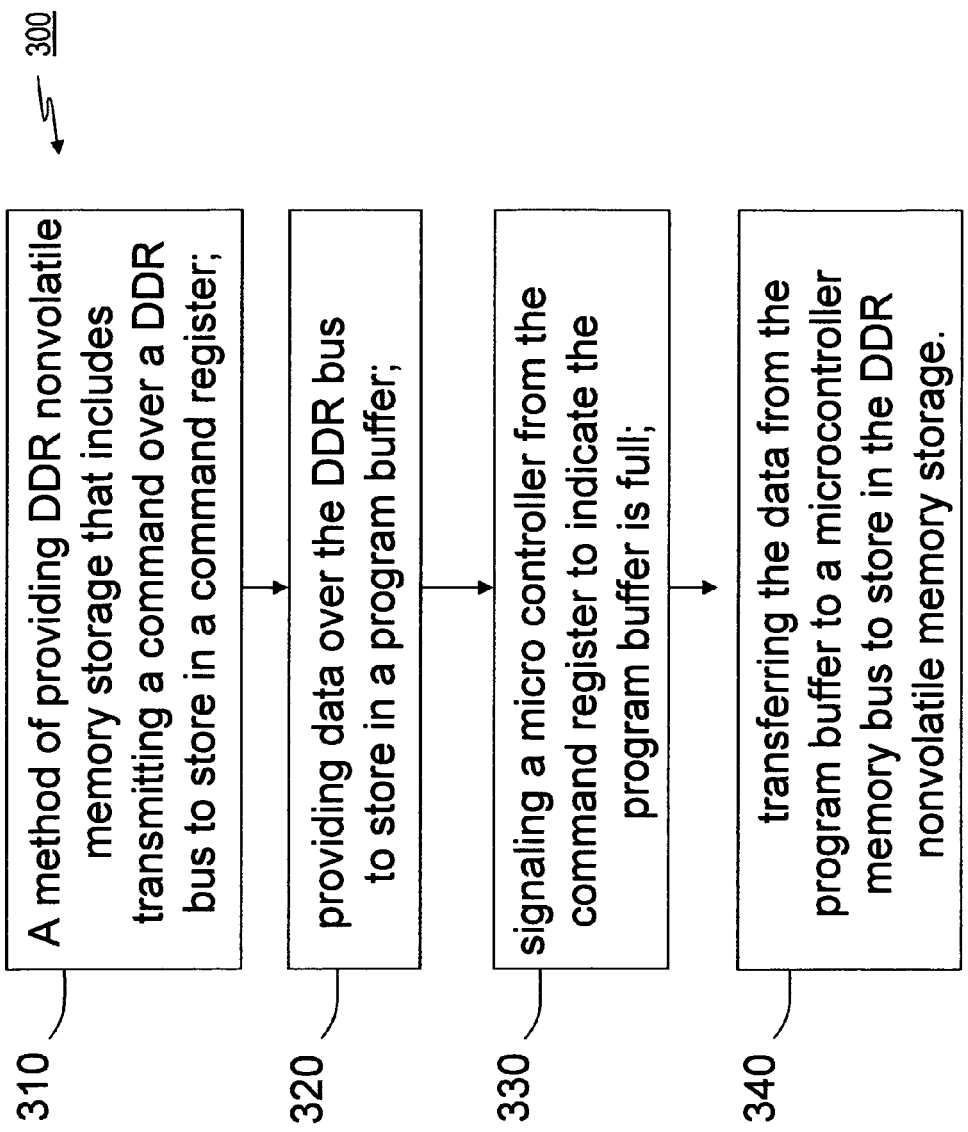
FIG. 3 is a flow diagram that illustrates a method of a host processor interfacing to the DDR nonvolatile memory.

FIG. 3 shows a flowchart in accordance with various embodiments of the present invention that illustrates an algorithm or process in accordance with the present invention that may be used to provide a flash memory with DDR behavior. Method 300 or portions thereof are performed by the processor/flash device combination of an electronic system. Method 300 is not limited by the particular type of apparatus, software element, or system performing the method. Also, the various actions in method 300 may be performed in the order presented, or may be performed in a different order.

Method 300 is shown beginning at block 310 where commands are received by DDR nonvolatile memory 30 over a DDR interface bus 204 to store in a command register. In block 320 data is provided over the DDR interface bus 204 to store in a program buffer 212. In block 330 a determination is made as to signaling (signal 220) a microcontroller 214 by the command registers 208 to indicate that program buffers 212 are full. In block 340 the data from program buffers 212 is transferred to a microcontroller memory bus 210 to store in the DDR nonvolatile memory storage (222).

By now it should be apparent that an architecture for a DDR flash device has been shown that accommodates legacy flash functions while implementing DDR behavior. Specifically, the non-array aspects of the DDR flash device are accounted for and addressed in the architecture to accommodate flash device latencies.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

The invention claimed is:

1. A method of accessing a Double Data Rate (DDR) nonvolatile memory, comprising:
    transmitting a command over a DDR bus to store in a command register; providing data over the DDR bus to store in a program buffer; detecting arrayed accesses from non-arrayed accesses, wherein array data us loaded onto a page buffer when an arrayed access is detected; decoding of the non-arrayed accesses during an active cycle;
    enabling a decode path for one or more of a register or SRAM element for the non-arrayed accesses;
    reading non-arrayed accesses data directly from the one or more of the register or SRAM element instead of the page buffer, wherein the array data and the non-arrayed accesses data are written to the one or more of the register or SRAM element;
    signaling a microcontroller from the command register to indicate the program buffer is full; and
    transferring the data from the program buffer to a microcontroller memory bus to store in the DDR nonvolatile memory.

2. The method of claim 1 further including transferring two data words per clock cycle at I/O pins for a read or write of the DDR nonvolatile memory.

3. The method of claim 1 further including directly writing two data words per clock to the command register without first writing to a page buffer.

4. The method of claim 1 wherein the non-arrayed accesses data is stored in one of SRAM arrays or registers, the SRAMS arrays or registers accessed through one of a burst read or write.

5. A Double Data Rate (DDR) nonvolatile memory, comprising:
    a DDR interface to operate at a first frequency in transferring data at I/O pins;
    a DDR interface bus coupled to the DDR interface to operate at a second frequency;
    a program buffer coupled to the DDR interface bus to store commands;
    command registers coupled to the DDR interface bus and to a microcontroller memory bus;
    one or more page buffers to hold array data for transfer to the DDR interface bus; and a microcontroller coupled to the microcontroller memory bus and coupled to receive a signal from the command registers,
    wherein the DDR interface decodes an address to determine arrayed accesses from non-arrayed accesses, loads the array data onto the one or more page buffers when an arrayed access is detected, decodes the non-arrayed accesses during an active cycle enables a decode path for one or more of a register or SRAM element for the non-arrayed accesses and reads non-arrayed accesses data directly from the one or more of the register or SRAM element instead of the one or more page buffers and writes the array data and the non-arrayed accesses data to the one or more of the register or SRAM element.

6. The DDR nonvolatile memory of claim 5 wherein the first frequency transfers two data words per clock cycle and the second frequency transfers one data word per clock cycle.

7. The DDR nonvolatile memory of claim 5 wherein the non-arrayed accesses are to data stored in Static Random Access Memory (SRAM) or the command registers or the program buffer.

8. A Double Data Rate (DDR) nonvolatile memory, comprising:
    a DDR interface block to transfer data at I/O pins at a first frequency;
    a DDR interface bus coupled to the DDR interface block to operate at a second frequency that is one half the first frequency;
    a microcontroller coupled to a microcontroller memory bus; and
    command registers and Static Random Access Memory (SRAM) coupled to the DDR interface bus and to the microcontroller memory bus,
    wherein the DDR interface block decodes an address to determine non-arrayed accesses to the command registers and SRAM from arrayed accesses, loads array data onto one or more of the page buffers when an arrayed access is determined, decodes the non-arrayed accesses during an active cycle enables a decode path for one or more of a register or SRAM element for the non-arrayed accesses and reads non-arrayed accesses data directly from the one or more of the register or SRAM element instead of the one or more page buffers and writes the array data and the non-array accesses data to the one or more of the register or SRAM element.

9. The DDR nonvolatile memory of claim 8 further wherein the one or more page buffers to hold the array data for transfer to the DDR interface bus.

10. The DDR nonvolatile memory of claim 9 wherein the command registers and SRAM signal the microcontroller when the program buffers are full.

11. The DDR nonvolatile memory of claim 8 wherein the command register is coupled to the DDR interface bus to store commands.

12. A wireless device, comprising:
    first and second antenna;
    a transceiver coupled to the first and second antenna;
    a processing device coupled to the transceiver; and a Double Data Rate (DDR) nonvolatile memory coupled to the processing device to transfer two data words per clock cycle at I/O pins for a read access of the DDR nonvolatile memory, wherein the DDR nonvolatile memory implements flash functions while maintaining DDR behavior,
    wherein the DDR nonvolatile memory includes a DDR interface and the DDR interface decodes an address to determine arrayed accesses from non-arrayed accesses, loads array data onto one or more of the page buffers when an arrayed access is determined, decodes the non-arrayed accesses during an active cycle enables a decode path for one or more of a register or SRAM element for the non-arrayed accesses, reads non-arrayed accesses data directly from the one or more of the register or SRAM element instead of the one or more page buffers and writes the array data and the non-array accesses data to the one or more of the register or SRAM element.

13. The wireless device of claim 12 wherein the DDR nonvolatile memory includes:
the DDR interface to transfer data at I/O pins of the DDR nonvolatile memory;
a DDR interface bus coupled to the DDR interface;
a microcontroller coupled to a microcontroller memory bus; and
command registers and SRAM coupled to the DDR interface bus and to the microcontroller memory bus.

14. The wireless device of claim 13 wherein the DDR nonvolatile memory further includes:
a program buffer coupled to the DDR interface bus to store commands.

15. The wireless device of claim 13 wherein the DDR nonvolatile memory comprises:
page buffers to hold array data for transfer to the DDR interface bus.

* * * * *